US010861772B2

(12) United States Patent
Liu et al.

(10) Patent No.: US 10,861,772 B2
(45) Date of Patent: Dec. 8, 2020

(54) CLAMPING MECHANISM FOR HEAT SINK AND ELECTRONIC DEVICE ASSEMBLY INCLUDING THE SAME

(71) Applicant: Tyco Electronics (Shanghai) Co. Ltd., Shanghai (CN)

(72) Inventors: WenYu Liu, Shanghai (CN); Hongqiang Han, Shanghai (CN); Hongwen Yang, Shanghai (CN); Lizhou Li, Shanghai (CN); Youwei Pan, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/059,221

(22) Filed: Aug. 9, 2018

(65) Prior Publication Data

US 2019/0051580 A1 Feb. 14, 2019

(30) Foreign Application Priority Data

Aug. 11, 2017 (CN) ...................... 2017 2 1002230 U

(51) Int. Cl.
*H01L 23/40* (2006.01)
*H05K 7/20* (2006.01)
*G02B 6/42* (2006.01)
*H01L 23/367* (2006.01)

(52) U.S. Cl.
CPC ...... *H01L 23/4093* (2013.01); *H01L 23/3672* (2013.01); *G02B 6/4268* (2013.01); *H05K 7/2049* (2013.01); *H05K 7/20418* (2013.01)

(58) Field of Classification Search
CPC ............ H01L 23/4093; H01L 23/3672; G02B 6/4268; H05K 7/20918; H05K 7/2049
See application file for complete search history.

(56) References Cited

U.S. PATENT DOCUMENTS

| | | | | |
|---|---|---|---|---|
| 9,160,090 B2 * | 10/2015 | Su | ...................... | H01R 12/7082 |
| 2009/0244851 A1 * | 10/2009 | Kuo | ................... | H01L 23/4093 |
| | | | | 361/719 |
| 2011/0157830 A1 * | 6/2011 | Yang | ................... | H01L 23/3672 |
| | | | | 361/701 |
| 2012/0140417 A1 * | 6/2012 | Aspas Puertolas | .. | H05K 7/2049 |
| | | | | 361/709 |
| 2013/0210269 A1 * | 8/2013 | Neer | ..................... | G02B 6/4246 |
| | | | | 439/487 |
| 2014/0321064 A1 * | 10/2014 | Bose | ................... | H01L 23/4093 |
| | | | | 361/720 |
| 2015/0180168 A1 * | 6/2015 | Han | ..................... | H01R 13/506 |
| | | | | 439/353 |

* cited by examiner

*Primary Examiner* — Zachary Pape
(74) *Attorney, Agent, or Firm* — Barley Snyder

(57) ABSTRACT

A clamping mechanism adapted to clamp a heat sink on a housing of an electronic device comprises a frame, a plurality of mounting legs connected on the frame, and a plurality of elastic tabs obliquely extending from the frame towards the heat sink. The frame has a rectangular shape and includes a first arm adapted to be connected to a front end of the housing, a second arm adapted to be connected to a rear end of the housing, and a pair of third arms connected between the first arm and the second arm. The mounting legs are configured to mount the frame on the housing. The elastic tabs press the heat sink against the housing. Each of the third arms has at least one of the elastic tabs.

15 Claims, 5 Drawing Sheets

CLAMPING MECHANISM FOR HEAT SINK AND ELECTRONIC DEVICE ASSEMBLY INCLUDING THE SAME

CROSS-REFERENCE TO RELATED APPLICATION

This application claims the benefit of the filing date under 35 U.S.C. § 119(a)-(d) of Chinese Patent Application No. 201721002230.7, filed on Aug. 11, 2017.

FIELD OF THE INVENTION

The present invention relates to an electronic device assembly and, more particularly, to an electronic device assembly having a clamping mechanism for a heat sink.

BACKGROUND

Heat generated during operation of an electronic device, such as a high-speed electronic device, reduces electrical performance of the electronic device. Thus, it is necessary to mount a heat sink on a housing of the electronic device to reduce the temperature thereof during operation.

It is known to mount a heat sink on the housing with a part of the heat sink fixed to the housing by a clamping mechanism. The heat sink, however, must be in good contact with an electronic module inserted into the electronic device to achieve a small thermal contact resistance, and a pressure exerted on the heat sink by the existing clamping mechanism is not enough to generate such a small thermal contact resistance. Further, a clamping force exerted by the existing clamping mechanism is concentrated on a certain point, which results in a non-uniform distribution of the clamping force on an actual heat dissipation contact surface, realizing insufficient heat dissipation.

SUMMARY

A clamping mechanism adapted to clamp a heat sink on a housing of an electronic device comprises a frame, a plurality of mounting legs connected on the frame, and a plurality of elastic tabs obliquely extending from the frame towards the heat sink. The frame has a rectangular shape and includes a first arm adapted to be connected to a front end of the housing, a second arm adapted to be connected to a rear end of the housing, and a pair of third arms connected between the first arm and the second arm. The mounting legs are configured to mount the frame on the housing. The elastic tabs press the heat sink against the housing. Each of the third arms has at least one of the elastic tabs.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
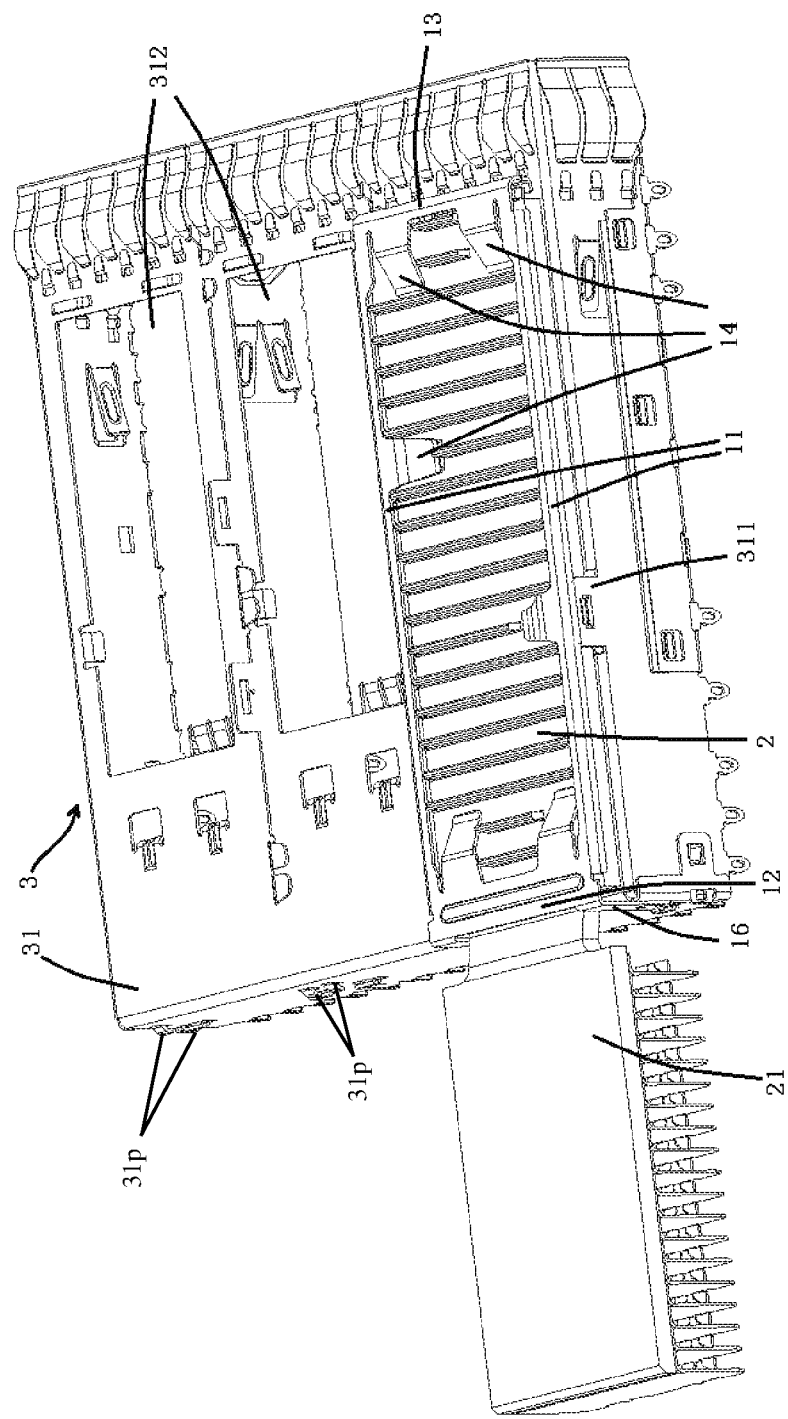
FIG. 1 is a side perspective view of an electronic device assembly according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

Figure 2:
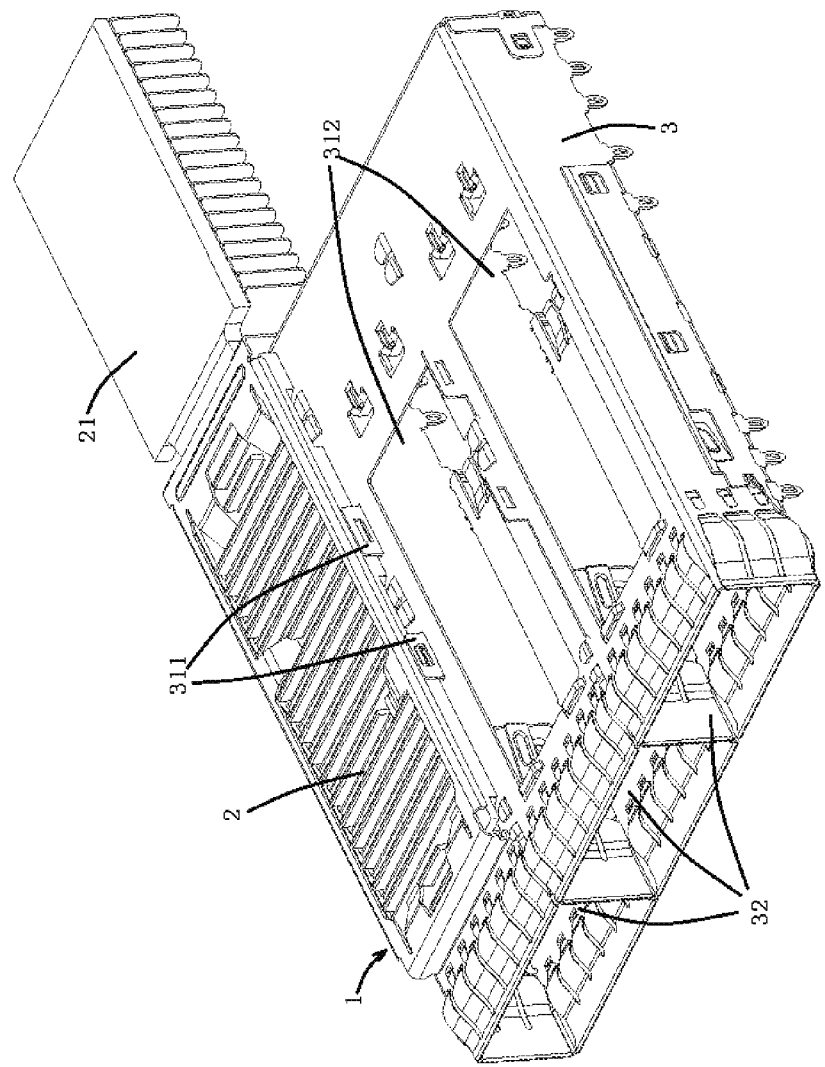
FIG. 2 is a front perspective view of the electronic device assembly.

An electronic device assembly according to an embodiment is shown in FIGS. 1 and 2. The electronic device assembly comprises an electronic device 3 adapted to receive at least one electronic module, at least one heat sink 2, and at least one clamping mechanism 1 corresponding to the heat sink 2. The clamping mechanism 1 is adapted to clamp the heat sink 2 onto a housing 31 of the electronic device 3 and achieve good contact of the heat sink 2 with the electronic module.

The electronic module may be any device capable of generating heat, such as a high-speed connector, an electronic package structure packaged with an electronic device such as a CPU, an amplifier, a photoelectric converter, a disk reader, and the like. In the embodiment shown in FIGS. 1-3, the electronic module is an electrical connector and the housing 31 has a generally cube shape. The housing 31 is provided with an opening for receiving the electrical connector at a front part thereof and a plurality of pins connected at a lower part thereof and adapted to be mounted to a mounting device such as a circuit board.

Figure 4:
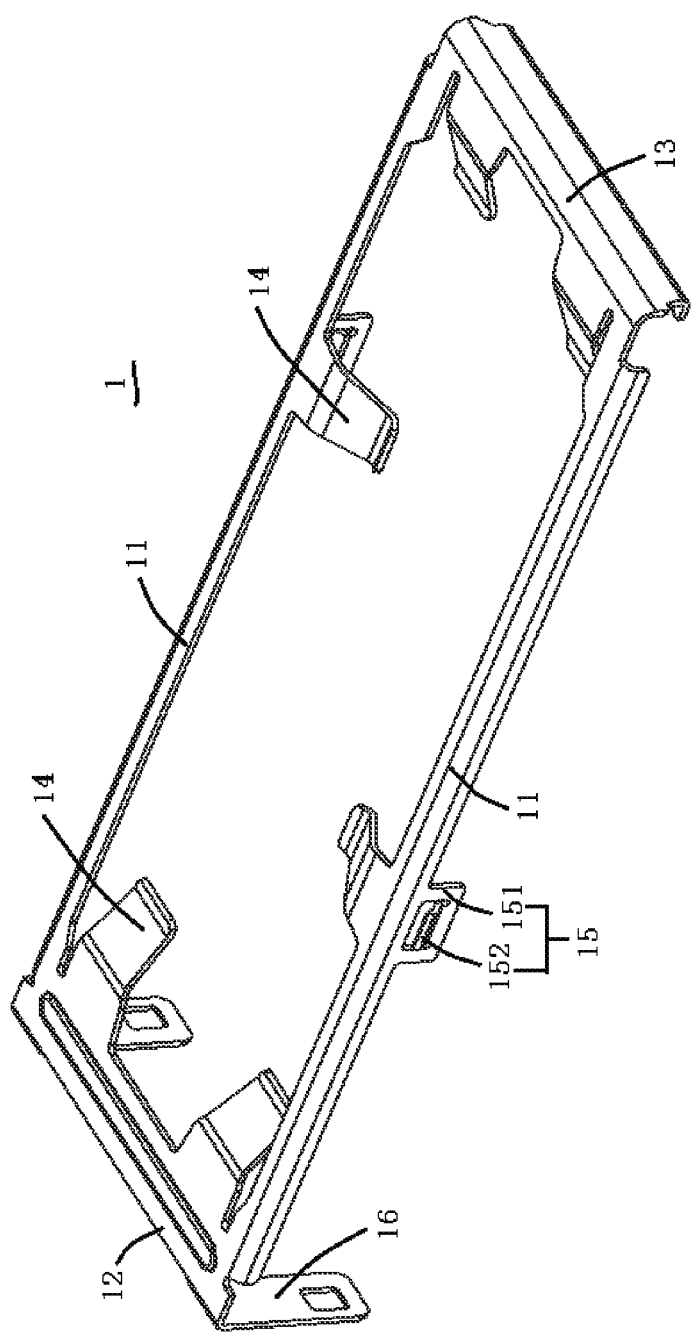
FIG. 4 is a perspective view of a clamping mechanism of the electronic device assembly.
Figure 5:
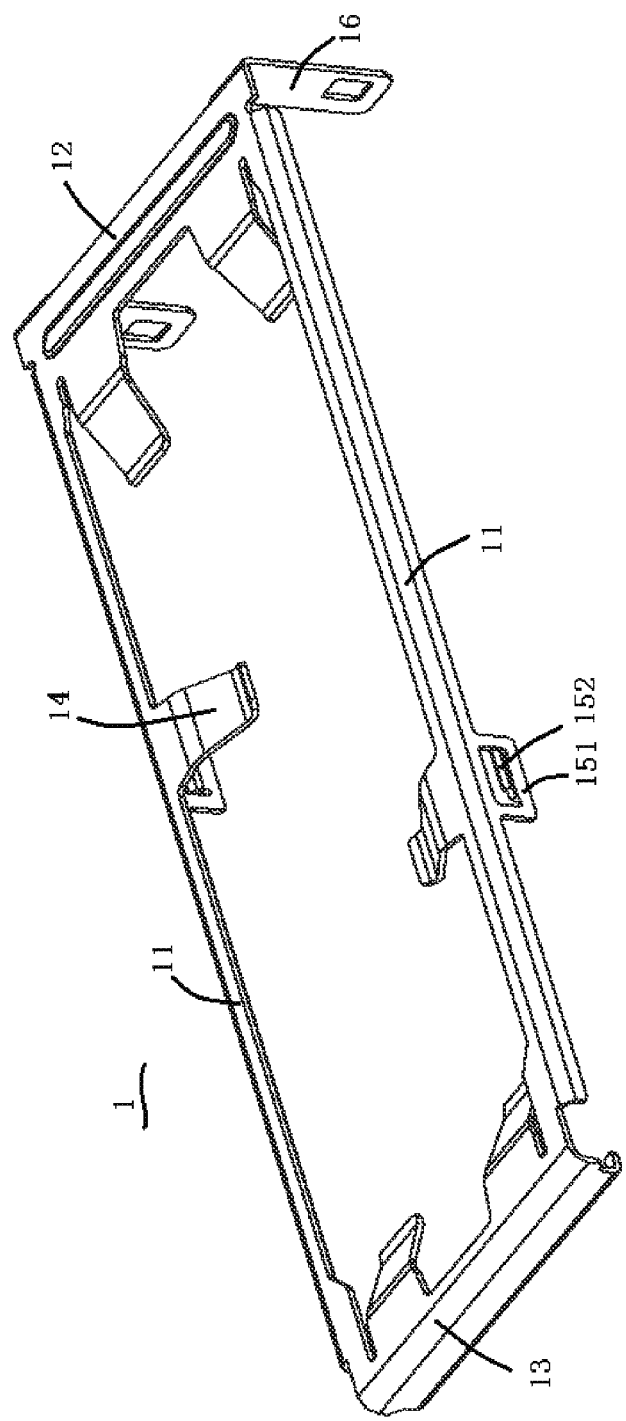
FIG. 5 is another perspective view of the clamping mechanism.

The clamping mechanism 1 is adapted to clamp the heat sink 2 onto the housing 31 of the electronic device 3. The clamping mechanism 1, as shown in FIGS. 4 and 5, comprises a rectangular frame including: a first arm 13 adapted to be connected to a front end of the housing 31, a second arm 12 adapted to be connected to a rear end of the housing 31, and two third arms 11 connected between the first arm 13 and the second arm 12. The clamping mechanism 1 further includes a plurality of mounting legs 15, 16 integrally connected with the frame and configured to mount the frame on the housing 31 and at least two elastic tabs 14 obliquely extending from the frame towards the heat sink 2 to press the heat sink 2 against the housing 31. Each of the two third arms 11 is provided with at least one of the elastic tabs 14.

Compared with an arrangement in which the first arm 13 and the second arm 12 at front and rear ends of the frame are each provided with the elastic tabs 14, since the two third arms 11 in a longitudinal direction of the frame are each provided with the elastic tabs 14, a clamping force to the heat sink 2 is more uniform. Further, it is possible to reduce bending deformation of the third arms 11 caused by large clamping force only exerted on the front and rear ends, which further avoids a non-uniform clamping force. Reduction of bending deformation of the third arms 11 results in more uniform and effective contact between the heat sink 2 and the electronic module, realizing better heat dissipation and a smaller thermal contact resistance. In the embodiment shown in FIGS. 4 and 5, each of the first arm 13 and the second arm 12 also has at least one elastic tab 14.

The mounting legs 15, 16, as shown in FIGS. 1, 4, and 5, include at least one first mounting leg 15 extending from at least one of the two third arms 11 towards the housing 31 perpendicular to the third arm 11 to engage with a mating lock 311 on the housing 31. By forming the first mounting leg 15 on the third arm 11 to engage with the mating lock 311 on the housing 31, the third arms 11 in the longitudinal direction are connected on the housing 31, thereby further reducing the deformation of the third arms 11. Moreover, the connection of the clamping mechanism 1 on the housing 31 may be more secure and reliable.

Each of the first mounting legs 15, as shown in FIGS. 4 and 5, includes a first body portion 151 extending from the third arm 11 and a locking tongue 152 obliquely and upwardly extending from the first body portion 151 in a direction away from the heat sink 2 so as to be snapped into a hole formed in the mating lock 311. In the shown embodiment, the first mounting legs 15 each are arranged at a position of the third arm 11 where the elastic tab 14 is disposed perpendicular thereto, respectively. By arranging the first mounting leg 15 at the position where the elastic tab 14 is disposed perpendicular thereto, forces applied on the third arm 11 by the first mounting legs 15 and the elastic tab 14 are concentrated to a point, thereby preventing the third arms 11 from generating a torsional moment, and avoiding the deformation of the third arms 11.

Figure 3:
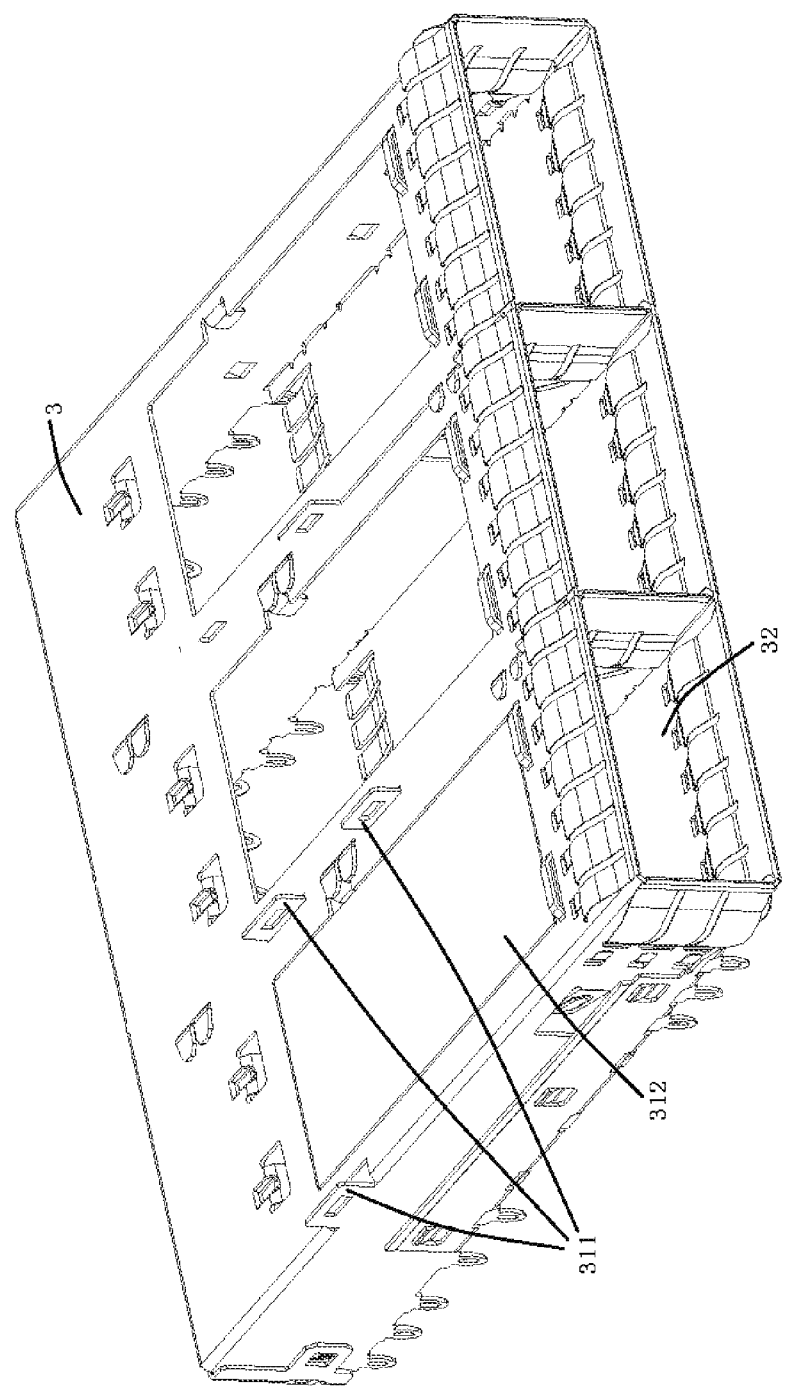
FIG. 3 is a perspective view of a housing of an electronic device of the electronic device assembly.

In the embodiment shown in FIGS. 4 and 5, the clamping mechanism 1 includes at least two first mounting legs 15 arranged in a staggered manner in a longitudinal direction of the third arm 11. By arranging the at least two first mounting legs 15 in the staggered manner, the clamping mechanism 1 may be applied to an electrical device 3 comprising a plurality of sub-electronic devices arranged in a row as shown in FIG. 3. In the embodiment shown in FIGS. 1-5, the electronic device 3 is adapted to receive three electronic modules arranged in a row. Further, since the first mounting legs 15 are arranged in the staggered manner, two adjacent clamping mechanisms 1 engage with the corresponding mating locks 311 shown in FIG. 3 through the first mounting legs 15 respectively to realize side-by-side installation of the clamping mechanisms 1 without interfering with each other.

The mounting legs 15, 16, as shown in FIGS. 1, 4, and 5, include at least one second mounting leg 16 extending from the second arm 12 towards the housing 31. The second mounting leg 16 is formed with a hole adapted to be engaged with a protrusion 31p on the housing 31 (see FIG. 1). As shown in FIG. 1, the clamping mechanism 1 is mounted onto the housing 31 through the second mounting leg 16 mounted on the rear end of the housing 31.

FIGS. 1-6 show an exemplary embodiment of the mounting and locking form of the mounting legs 15, 16 and the housing 31. It should be appreciated for those skilled in the art that the mounting manner is not limited to the disclosure and, in other embodiments, other structures capable of achieving the same function may also be employed.

The electronic device 3, as shown in FIGS. 1-3, has at least one insertion channel 32 extending in an insertion direction in which the electronic module is inserted. The housing 31 is formed with at least one opening 312 corresponding to the at least one insertion channel 32 and communicated with the insertion channel 32, respectively. The opening 312 is covered with the heat sink 2. An inner surface of the heat sink 2 facing the housing 31 is in contact with the electronic module. As shown in the embodiment of FIG. 1, the heat sink 2 further comprises an additional heat sink portion 21 extending from a rear end of the heat sink 2 to an outside of the housing 31. With the above structure, the contact with and heat dissipation of the electronic module through the heat sink 2 are achieved.

The electronic device 3, as shown in FIGS. 1-3, further comprises a mating lock 311 protruding from a side surface of the housing 31 facing the clamping mechanism 1 and engaged with the first mounting leg 15 of the clamping mechanism 1. The electronic device 3 has at least two insertion channels 32 to receive at least two electronic modules, respectively. The electronic device assembly further comprises at least two heat sinks 2 corresponding to the at least two insertion channels 32 and at least two clamping mechanisms 1 as mentioned in the above embodiments.

As described above, in the electronic device 3 comprising at least two insertion channels 32 to receive at least two electronic modules, respectively, the first mounting legs 15 of at least two clamping mechanisms 1 are arranged in the staggered manner in the longitudinal direction of the third arm 11. In this way, the at least two clamping mechanisms 1 are mounted onto the housing 31 without interference with each other so as to clamp at least two heat sinks 2 on the housing 31 and dissipate heat from the at two electronic modules, respectively.

What is claimed is:

1. A clamping mechanism adapted to clamp a heat sink on a housing of an electronic device, comprising:
    a frame having a rectangular shape and including a first arm adapted to be connected to a front end of the housing, a second arm adapted to be connected to a rear end of the housing, and a pair of third arms connected between the first arm and the second arm;
    a plurality of mounting legs connected on the frame and configured to mount the frame on the housing, the plurality of mounting legs having a first mounting leg extending from each one of the third arms toward the housing and in a direction perpendicular to each one of the third arms and a second mounting leg extending from the second arm towards the housing; and
    a plurality of elastic tabs obliquely extending from the frame towards the heat sink and pressing the heat sink against the housing, each of the third arms having at least one of the elastic tabs, wherein each first mounting leg is arranged at a position on each third arm where the elastic tab is disposed perpendicular thereto, and the second mounting leg is arranged at a position on the second arm where another one of the elastic tabs is disposed perpendicular thereto, and wherein each of the plurality of elastic tabs of the second arm and the third arm are arranged at a position corresponding to a position of one of the plurality of mounting legs, and each of the plurality of mounting legs of the second arm and the third arm are arranged at a position corresponding to a position of one of the plurality of elastic tabs.

2. The clamping mechanism of claim 1, wherein the first mounting legs engages with a mating lock on the housing.

3. The clamping mechanism of claim 2, wherein each of the first mounting legs includes a first body portion extending from the third arm and a locking tongue obliquely and upwardly extending from the first body portion in a direction away from the heat sink.

4. The clamping mechanism of claim 3, wherein the locking tongue engages in a hole formed in the mating lock.

5. The clamping mechanism of claim 3, wherein the locking tongue and the first body portion define a recess therebetween receiving the mating lock on the housing.

6. The clamping mechanism of claim 2, wherein the first mounting legs each extending from one of the third arms are arranged in a staggered manner along a longitudinal direction of the third arms.

7. The clamping mechanism of claim 6, wherein the first mounting legs are staggered on the third arms such that no mounting leg extending from one of the third arms corresponds in position along the longitudinal direction of the third arm with a position of a mounting leg extending from the other one of the third arms.

8. The clamping mechanism of claim 1, wherein each of the first arm and the second arm have at least one of the elastic tabs.

9. The clamping mechanism of claim 1, wherein the second mounting leg has a hole engaging a protrusion on the housing.

10. The clamping mechanism of claim 1, wherein the first arm defines a lip extending over its length in a longitudinal direction of the first arm, the lip including a free end opposing a bottom side of the first arm and extending in a direction toward the second arm.

11. A clamping mechanism adapted to clamp a heat sink on a housing of an electronic device, comprising:
  a rectangular frame including:
    a first arm adapted to be connected to a front end of the housing;
    a second arm adapted to be connected to a rear end of the housing;
    a third arm connected between a first end of the first arm and a first end of the second arm; and
    a fourth arm connected between a second end of the first arm and a second end of the second arm;
  a plurality of mounting legs connected to the frame and configured to mount the frame on the housing, including:
    a first mounting leg and a second mounting leg extending generally perpendicularly toward the housing from a respective one of the first end of the second arm and the second end of the second arm; and
    a third mounting leg and a fourth mounting leg extending generally perpendicularly toward the housing from a respective one of the third arm and the fourth arm, wherein the third mounting leg and the fourth mounting leg are staggered on the third arm and the fourth arm such that the third mounting leg is positioned at a first distance from the first arm along a longitudinal direction of the third arm and the fourth mounting leg is positioned at a second distance from the first arm along a longitudinal direction of the fourth arm, distinct from the first distance; and
  a plurality of elastic tabs obliquely extending from the frame towards the heat sink and pressing the heat sink against the housing, including:
    a first elastic tab arranged at position on the second arm corresponding to a position of the first mounting leg and disposed perpendicularly thereto;
    a second elastic tab arranged at position on the second arm corresponding to a position of the second mounting leg and disposed perpendicularly thereto;
    a third elastic tab arranged at a position on the third arm corresponding to a position of the third mounting leg and disposed perpendicularly thereto;
    a fourth elastic tab arranged at a position on the fourth arm corresponding to a position of the fourth mounting leg and disposed perpendicularly thereto; and
    a fifth elastic tab arranged proximate the first end of the first arm and disposed perpendicularly thereto and a sixth elastic tab arranged proximate the second end of the first arm and disposed perpendicularly thereto.

12. The clamping mechanism of claim 11, wherein each of the third mounting leg and the fourth mounting leg includes a first body portion extending from a respective one of the third arm and the fourth arm and a locking tongue obliquely and upwardly extending from the first body portion in a direction away from the heat sink, the locking tongue and the first body portion defining a recess therebetween receiving a mating lock of the housing.

13. The clamping mechanism of claim 11, wherein every elastic tab on the second arm, the third arm and the fourth arm is arranged at a position corresponding to the position of a respective mounting leg arranged on the second arm, the third arm and the fourth arm.

14. The clamping mechanism of claim 11, wherein the third mounting leg and the fourth mounting leg are staggered such that no portion of the third mounting leg overlaps the fourth mounting leg in any direction extending generally perpendicularly from the third mounting arm toward the fourth mounting arm.

15. The clamping mechanism of claim 11, wherein the first arm defines a lip extending over its length in a longitudinal direction of the first arm, the lip including a free end opposing a bottom side of the first arm and extending in a direction toward the second arm.

* * * * *